United States Patent
Hseih et al.

(10) Patent No.: US 9,698,191 B2
(45) Date of Patent: Jul. 4, 2017

(54) SYSTEM AND METHOD TO EXTEND NEAR INFRARED SPECTRAL RESPONSE FOR IMAGING SYSTEMS

(71) Applicant: QUALCOMM Incorporated, San Diego, CA (US)

(72) Inventors: Biay-Cheng Hseih, Irvine, CA (US); Sergiu Radu Goma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 14 days.

(21) Appl. No.: 14/832,290

(22) Filed: Aug. 21, 2015

(65) Prior Publication Data

US 2017/0053964 A1 Feb. 23, 2017

(51) Int. Cl.
*H01L 27/146* (2006.01)

(52) U.S. Cl.
CPC .. *H01L 27/14649* (2013.01); *H01L 27/14627* (2013.01); *H01L 27/14629* (2013.01); *H01L 27/14685* (2013.01)

(58) Field of Classification Search
CPC .................................................. H01L 27/14649
See application file for complete search history.

(56) References Cited

U.S. PATENT DOCUMENTS

| | | | |
|---|---|---|---|
| 8,389,921 B2 | 3/2013 | Nozaki et al. | |
| 8,716,823 B2 | 5/2014 | Lenchenkov | |
| 8,941,203 B2 | 1/2015 | Wehner et al. | |
| 2006/0068586 A1* | 3/2006 | Pain .................. | H01L 27/14601 438/643 |
| 2009/0194671 A1 | 8/2009 | Nozaki et al. | |
| 2012/0287297 A1 | 11/2012 | Fukuda | |
| 2012/0313205 A1* | 12/2012 | Haddad ............. | H01L 31/02363 257/432 |
| 2013/0113964 A1 | 5/2013 | Sasaki et al. | |
| 2014/0077323 A1* | 3/2014 | Velichko ........... | H01L 27/14627 257/432 |
| 2015/0228689 A1 | 8/2015 | Lenchenkov | |

FOREIGN PATENT DOCUMENTS

JP    2009088415 A    4/2009

OTHER PUBLICATIONS

International Search Report and Written Opinion—PCT/US2016/043307—ISA/EPO—Oct. 24, 2016.

* cited by examiner

*Primary Examiner* — Casey Bryant
(74) *Attorney, Agent, or Firm* — Knobbe, Martens, Olson & Bear, LLP

(57) ABSTRACT

One innovation includes an IR sensor having an array of sensor pixels to convert light into current, each sensor pixel of the array including a photodetector region, a lens configured to focus light into the photodetector region, the lens adjacent to the photodetector region so light propagates through the lens and into the photodetector region, and a substrate disposed with photodetector region between the substrate and the lens, the substrate having one or more transistors formed therein. The sensor also includes reflective structures positioned between at least a portion of the substrate and at least a portion of the photodetector region and such that at least a portion of the photodetector region is between the one or more reflective structures and the lens, the one or more reflective structures configured to reflect the light that has passed through at least a portion of the photodetector region into the photodetector region.

30 Claims, 7 Drawing Sheets

NIR BSI SENSOR

NIR BSI SENSOR

SYSTEM AND METHOD TO EXTEND NEAR INFRARED SPECTRAL RESPONSE FOR IMAGING SYSTEMS

BACKGROUND

Field

This disclosure generally relates to providing improved or extended spectral response to near infrared light or signals in photographic and/or other image capture devices. More specifically, this disclosure relates to improving or extending the capabilities of a photodetector or photodiode to detect or receive a near infrared light or signal in an image sensor.

Description of the Related Art

Various configurations of imaging equipment may use near infrared (NIR) or longer wavelength light or signals for a variety of purposes. For example, human-machine interfaces (HMI) may utilize NIR or IR light or signals to communicate movement or other commands, for example gesture control. Machine "vision" systems may use NIR or longer wavelength light, allowing a machine or computer to "see" or otherwise optically view a scene or event. In many instances, one or more NIR sensors may sense the NIR signals, for example a back-side illuminated (BSI) sensor capable of detecting NIR signals. As advances in technology lead to the reduction in size of computers and other machines, the NIR sensors used in these devices may also become smaller. However, some image sensors may physically be unable to fully realize a NIR signal, for example due to the longer wavelength of NIR signals. Accordingly, systems and methods to allow these image sensors to more fully realize NIR signals in an imaging system would be beneficial.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description," one will understand how the features of the various embodiments of this invention provide advantages.

One innovating aspect of the subject matter described in this disclosure can be implemented in an infrared (IR) sensor for capturing an image, comprising an array of sensor pixels configured to convert light into current. Each sensor pixel of the array of sensor pixels comprises a photodetector region configured to convert the light into current and a lens configured to focus light, that is incident on the lens, into the photodetector region, the lens positioned adjacent to the photodetector region such that incident light propagates through the lens and into the photodetector region. Each sensor pixel further comprises a substrate disposed such that the photodetector region is between the substrate and the lens, the substrate having one or more transistors formed therein and one or more reflective structures positioned between at least a portion of the substrate and at least a portion of the photodetector region and such that at least a portion of the photodetector region is between the one or more reflective structures and the lens, the one or more reflective structures configured to reflect the light that has passed through at least a portion of the photodetector region into the photodetector region.

Another innovative aspect of the subject matter described in this disclosure can also be implemented in a method for capturing an image via an IR sensor having an array of sensor pixels. The method comprises focusing light, via a lens, onto a photodetector region of a pixel of the array of sensor pixels and converting the light into current via the photodetector region. The method further comprises reflecting the light propagating through at least a portion of the photodetector region into the photodetector region via one or more reflective structures, wherein reflecting the light into the photodetector region increases a distance which the light travels within the photodetector region.

Another innovative aspect of the subject matter described in this disclosure can also be implemented in a method for manufacturing an IR sensor for capturing an image, the IR sensor including an array of sensor pixels. The method comprises forming a photodetector region configured to convert light into current. The method further comprises forming a lens configured to focus light that is incident on the lens onto the photodetector region, the lens positioned adjacent to the photodetector region such that the incident light propagates through the lens and into the photodetector region. The method also comprises forming a substrate disposed such that the photodetector region is between the substrate and the lens, the substrate having one or more transistors formed therein. The method also further comprises forming one or more reflective structures positioned between at least a portion of the substrate and at least a portion of the photodetector region and such that at least a portion of the photodetector region is between the one or more reflective structures and the lens, the one or more reflective structures configured to reflect the light that has passed through at least a portion of the photodetector region into the photodetector region.

BRIEF DESCRIPTION OF THE DRAWINGS

The above-mentioned aspects, as well as other features, aspects, and advantages of the present technology will now be described in connection with various embodiments, with reference to the accompanying drawings. The illustrated embodiments, however, are merely examples and are not intended to be limiting. Throughout the drawings, similar symbols typically identify similar components, unless context dictates otherwise. Note that the relative dimensions of the following figures may not be drawn to scale.

DETAILED DESCRIPTION

Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure may be thorough and complete, and may fully convey the scope of the disclosure to those skilled in the art. The scope of the disclosure is intended to cover aspects of the systems, apparatuses, and methods disclosed herein, whether implemented independently of, or combined with, any other aspect of the invention. For example, an apparatus may be implemented or a method may be practiced using any number of the aspects set forth herein. In addition, the scope of embodiments of the invention, including those described herein, is intended to cover such an apparatus or method which is practiced using other structure, functionality, or structure and functionality in addition to or other than the various aspects of the embodiments set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to various imaging and photographic technologies, system configurations, computational systems, flash systems, and exposure determination systems. The Detailed Description and drawings are intended to be illustrative of the disclosure of embodiments of the invention, rather than limiting.

In some embodiments, the imaging systems described may detect light within the visible range or near infrared ("NIR") or longer wavelength light (for example, infrared ("IR"), etc.). For clarity of description, "NIR light" will refer any light with a wavelength within the NIR range or having a wavelength longer than NIR light.

Figure 1:
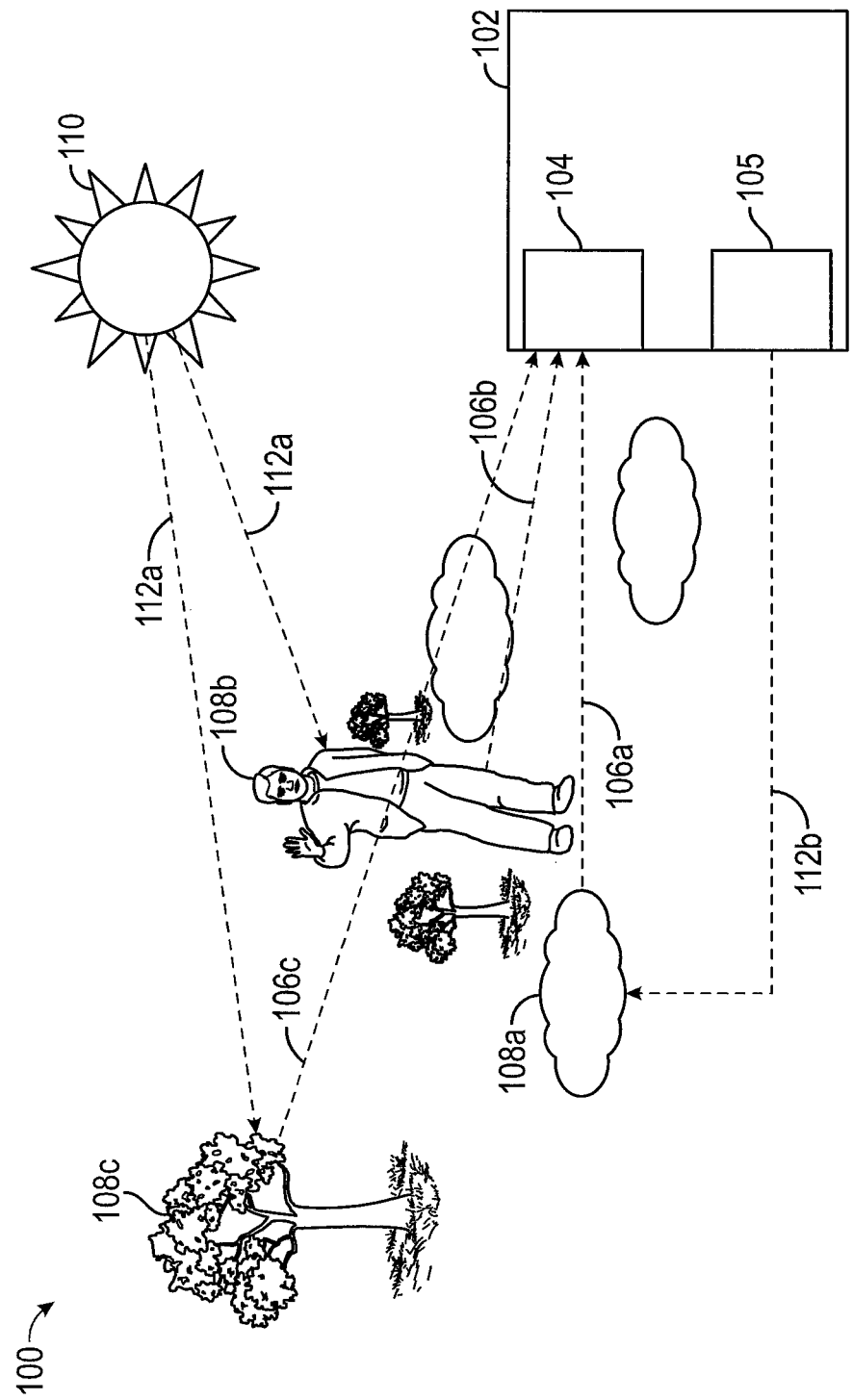
FIG. 1 is a diagram illustrating a scene, an image capture device, and various target objects in the scene and within a field of view of the image capture device, in accordance with an exemplary implementation.

FIG. 1 is a diagram illustrating a scene, an image capture device, and various target objects in the scene and within a field of view of the image capture device, in accordance with an exemplary implementation. As shown in FIG. 1, the image capture device ("camera") 102 may include a near infrared ("NIR") sensor 104 and an "artificial NIR light source ("NIR source") 105, for example, a flash light source or another artificial light source on or coupled to the camera 102. The NIR source 105 may be referred to as a first NIR source. The field of view ("FOV") of the camera 102 may include target objects 108a-c, including a bush 108a, a person 108b, and a tree 108c. The scene 100 may further include an external NIR source 110 independent from the camera 102, the example, a natural light source (the sun) or an artificial light source not on the camera 102. Reflected light 106a-c represents paths of NIR light reflected off of the target objects 108a-c, respectively. Emitted light 112a represents paths of NIR light emitted from the external NIR source 110. Emitted light 112b represents some paths of NIR light emitted from the NIR source 105.

The NIR sensor 104 may sense NIR light (or NIR signals), for example via optics of the camera 102 not shown in this figure, and thus capture an image of the FOV of the camera 102 based on the sensed NIR light. The NIR light sensed by the NIR sensor 104 may include the reflected light 106a-c which was emitted from NIR source 105 and reflected from the target objects 108a-c, emitted light 112a from the external NIR source 110 and/or emitted light 112b from the NIR source 105, or a combination of both the reflected light 106a-c and the emitted light 112a and 112b. In other words, the NIR sensor 104 may absorb the emitted light 112a and 112b emitted from the external NIR source 110 and NIR source 105 directly or after it reflects off of the target objects 108a-c within the FOV of the camera 102. In some embodiments, the emitted light 112 NIR source 105 may be a flash, emitting emitted light 112a when the camera 102 is used to capture an image using the NIR sensor 104. In other embodiments, the NIR source 105 may provide constant illumination for the duration of a NIR sensor 104 sensing period. In some embodiments, the NIR sensor 104 and the NIR source 105 may be two components that are configured to operate together or may be integrated into a single component. The NIR sensor 104 may be configured to generate an image of the FOV based on the absorbed light. The NIR sensor 104 may include one or more NIR sensing elements (which may be referred to as pixels herein) as will be described in further detail below.

As with the NIR source 105, the external NIR source 110 may function independently of the camera 102 (for example, as a constantly illuminated source, for example, the sun) or may function dependent upon the camera 102 (for example, as an external flash). For example, the external NIR source 110 may comprise an exterior light that constantly emits the emitted light 112 within the FOV of the camera 102 or in a portion of the FOV of the camera 102.

In some embodiments, the camera 102 may include a device capable of capturing a still or moving image, regardless of format (digital, film, etc.) or type (video camera, still camera, web camera, etc.). The camera 102 may determine a distance to or depth of a target scene or a target object (that is, an object in the target scene) based on one or more signals received from the NIR sensor 104. For clarity of description, "target object" will refer to both a target scene and a target object in the context of being subject matter on which the camera is focused.

The emitted light 112 represent the paths light from the NIR source 105 and the external NIR source 110 may propagate. from the NIR source 105 and the external NIR source 110 to the target objects 108a-c. The embodiment of FIG. 1 shows the NIR sensor 104 receiving the reflected light 106a-c from the target objects 108a-c within the FOV of the camera 102. As shown, the target objects 108a-c may be at various depths from the camera 102. However, in some embodiments, the target objects 108a-c may be at a single depth from the camera 102. Target objects 108a-c each reflect reflected light 106a-c representing NIR light reflecting off of the target objects 108a-c.

Figure 2:
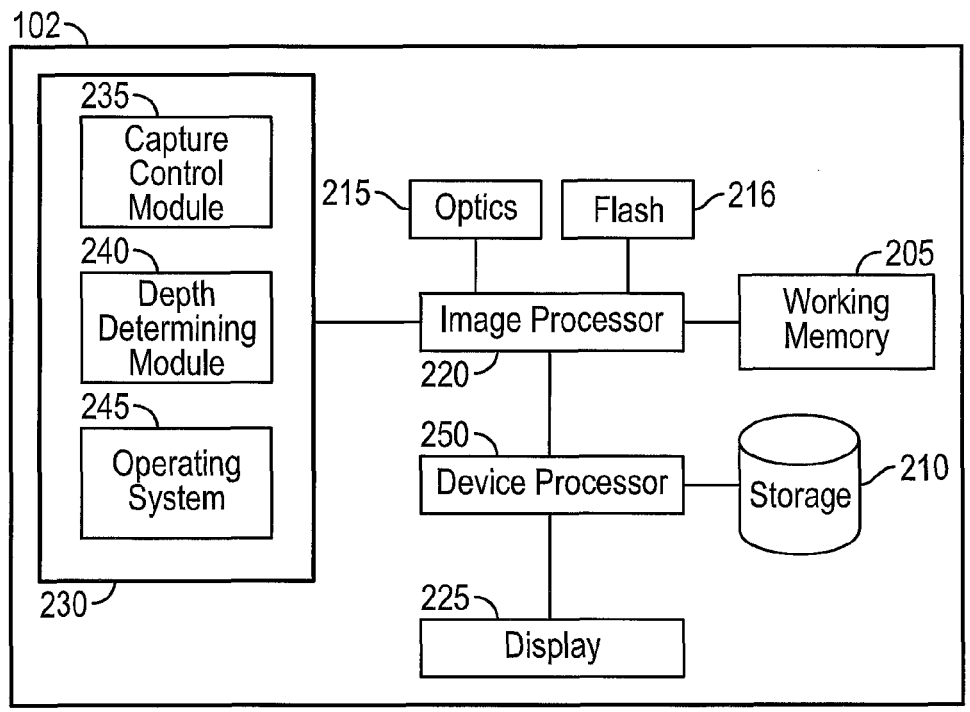
FIG. 2 is a block diagram illustrating an example of one embodiment of an image capture device using an NIR sensor.

FIG. 2 is a block diagram illustrating an example of one embodiment of an image capture device using an NIR sensor. FIG. 2 illustrates a high-level block diagram of an example of some embodiments of a camera 102 having a set of components including an image processor 220 linked to an optics 215, a flash (or other light source) 216, and to modules for operating the camera 102. The image processor 220 may also be in communication with a working memory 205, a memory 230, and a device processor 250, which in turn may be in communication with electronic storage module ("storage") 210, and a display 225 (for example an electronic or touchscreen display). In some embodiments, a single processor may comprise both the image processor 220 and the device processor 250 instead of two separate processors as illustrated in FIG. 2. Some embodiments may include three or more processors. In some embodiments, some of the components described above may not be included in the camera 102 or additional components not described above may be included in the camera 102. In some embodiments, one or more of the components described above or described as being included in the camera 102 may be combined or integrated into any other component of the camera 102.

The camera 102 may be, or may be part of, a cell phone, digital camera, tablet computer, personal digital assistant, laptop computer, personal camera, action camera, mounted camera, connected camera, wearable device, automobile, drone, or the like. The camera 102 may also be a stationary computing device or any device in which depth sensing would be advantageous. A plurality of applications may be available to the user on the camera 102. These applications may include traditional photographic and video applications, high dynamic range imaging, panoramic photo and video, or stereoscopic imaging such as 3D images or 3D video.

Still referring to FIG. 2, the camera 102 includes the optics/lens ("optics") 215 for capturing images of target objects and/or scenes. The optics 215 may include at least one sensor and at least one optical imaging component that focuses light received from the FOV of the camera 102 (for example, the FOV of the optics 215) onto the at least one sensor. For example, the at least one sensor may comprise a CMOS or CCD sensor, such as the NIR sensor 104 described in relation to FIG. 1. In some embodiments, the camera 102 may include more than one optics 215 or more than one sensor within the optics 215. The optics 215 may be coupled to the image processor 220 to transmit a captured image to the image processor 220. In this embodiment, signals to and from the optics 215 are communicated through the image processor 220.

The camera 102 may include the flash 216. In some embodiments, the camera 102 may include at least one flash 216. The flash 216 may include, for example, a flash bulb, a reflector, a geometric light pattern generator, an LED flash, or a NIR light source (such as NIR source 105 as referenced in FIG. 1). The image processor 220 can be configured to receive signals from and transmit signals to the flash 216 to control the flash.

As illustrated in FIG. 2, the image processor 220 is connected to the memory 230 and the working memory 205. In the illustrated embodiment, the memory 230 may be configured to store the capture control module 235, the depth determining module 240, and the operating system 245. Additional modules may be included in some embodiments, or fewer modules may be included in some embodiments. These modules may include instructions that configure the image processor 220 to perform various image processing and device management tasks. The working memory 205 may be used by the image processor 220 to store a working set of processor instructions or functions contained in one or more of the modules of the memory 230. The working memory 205 may be used by the image processor 220 to store dynamic data created during the operation of the camera 102 (e.g., one or more target object depth measurements, etc.). While additional modules or connections to external devices or hardware may not be shown in this figure, they may exist to provide other exposure and focus adjustment and estimation options or actions.

As mentioned above, the image processor 220 may be configured by or may operate in conjunction with several modules stored in the memory 230. The capture control module 235 may include instructions that control the overall image capture functions of the camera 102. For example, the capture control module 235 may include instructions that configure the image processor 220 to capture raw image data of the target object using the optics 215. The capture control module 235 may also be configured to activate the flash 216 when capturing the raw image data. In some embodiments, the capture control module 235 may be configured to store the captured raw image data in the electronic storage module 210 or to display the captured raw image data on the display 225. In some embodiments, the capture control module 235 may direct the captured raw image data to be stored in the working memory 205. In some embodiments, the capture control module 235 may call one or more of the other modules in the memory 230, for example the depth determining module 240, to perform a depth determination technique on images captured by the optics 215 and output a depth map or depth information to image processor 220.

The depth determining module 240 may comprise instructions that configure the image processor 220 to perform depth determination, depth matching, or depth mapping techniques on captured image data. For example, the optics 215 may capture a view of the target objects (FIG. 2). The depth determining module 240 may configure the image processor 220 to perform a depth determining operation on the target object(s) 108 of the FOV of the optics 215. The depth determination may include disparity matching, or any other depth determining operation.

Still referring to FIG. 2, the operating system 245 may configure the image processor 220 to manage the working memory 205 and the processing resources of camera 102. For example, the operating system 245 may include device drivers to manage hardware resources such as the optics 215 and the flash 216. Therefore, in some embodiments, instructions contained in the processing modules discussed above and below may not interact with these hardware resources directly, but instead interact with this hardware through standard subroutines or APIs located in the operating system 245. Instructions within the operating system 245 may then interact directly with these hardware components. The operating system 245 may further configure the image processor 220 to share information with the device processor 250. The operating system 245 may also include instructions allowing for the sharing of information and resources between the various processing modules of the camera 102.

The device processor 250 may be configured to control the display 225 to display the captured image, or a preview of the captured image, to a user. The display 225 may be external to the camera 102 or may be part of the camera 102. The display 225 may also be configured to provide a view finder displaying a preview image for a use prior to capturing an image, or may be configured to display a captured image stored in memory or recently captured by the user. The display 225 may include a panel display, for example, an LCD screen, an LED screen, or other display technologies, and may implement touch sensitive technologies. The device processor 250 may also be configured to receive an input from the user. For example, the display 225 may also be configured to be a touchscreen, and thus may be configured to receive an input from the user. The user may use the display 225 to input information that the device processor 250 may provide to the depth determining module 240. For example, the user may use the display 225 to select a target object from the FOV shown on or in the display 225. The device processor 250 may receive that input and provide it to the depth determining module 240, which may use the input to select specific objects for the depth determination operations.

In some embodiments, the device processor 250 may be configured to control the one or more of the processing modules in the memory 230 or to receive inputs from one or more of the processing modules in the memory 230. The device processor 250 may write data to the electronic storage module 210, for example data representing captured images. While the electronic storage module 210 is represented graphically as a traditional disk device, in some embodiments, the electronic storage module 210 may be configured as any storage media device. For example, the electronic storage module 210 may include a disk drive, such as a floppy disk drive, hard disk drive, optical disk drive or magneto-optical disk drive, or a solid state memory such as a FLASH memory, RAM, ROM, and/or EEPROM. The electronic storage module 210 can also include multiple memory units, and any one of the memory units may be configured to be within the camera 102, or may be external to the camera 102. For example, the electronic storage module 210 may include a ROM memory containing system program instructions stored within the camera 102. The electronic storage module 210 may also include memory cards or high speed memories configured to store captured images which may be removable from the camera.

Although FIG. 2 depicts the camera 102 having separate components to include the device processor 250, the image processor 220, and the electronic storage module 210 (among other components), in some embodiments these separate components may be combined in a variety of ways to achieve particular design objectives. For example, in an alternative embodiment, the memory components (for example, electronic storage module 210 or working memory 205 or memory 230) may be combined with processor components (for example, image processor 220 and/or device processor 250) to save cost and improve performance.

Additionally, although FIG. 2 illustrates a number of memory components, including the memory 230 comprising several processing modules and a separate memory comprising a working memory 205, in some embodiments, different memory architectures may be utilized. For example, a design may utilize ROM or static RAM memory for the storage of processor instructions implementing the modules contained in memory 230. The processor instructions may be loaded into RAM to facilitate execution by the image processor 220. For example, working memory 205 may comprise RAM memory, with instructions loaded into working memory 205 before execution by the image processor 220. In some embodiments, one or more of the processing modules may be software stored in the memory 230 or may comprise a hardware system combined with the software components. Furthermore, functions associated above with one of the image processor 220 and the device processor 250 may be performed by the other of the image processor 220 and the device processor 250 or both the image processor 220 and the device processor 250, though not described as such above.

Figure 3A:
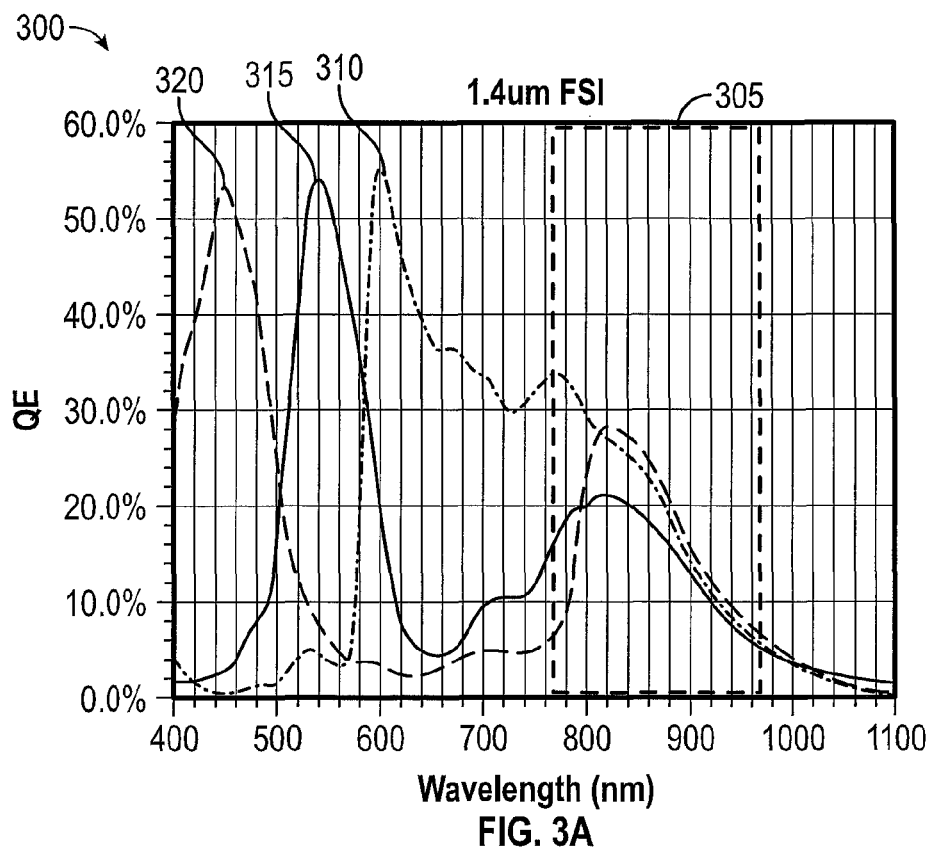
FIGS. 3A and 3B each include a graph indicating spectral responses of a front-side illumination (FSI) device (FIG. 3A) and a back-side illuminated (BSI) image sensor (FIG. 3B), highlighting the NIR wavelength region and the associated ability for the respective devices to realize signals having wavelengths within the NIR region.
Figure 3B:
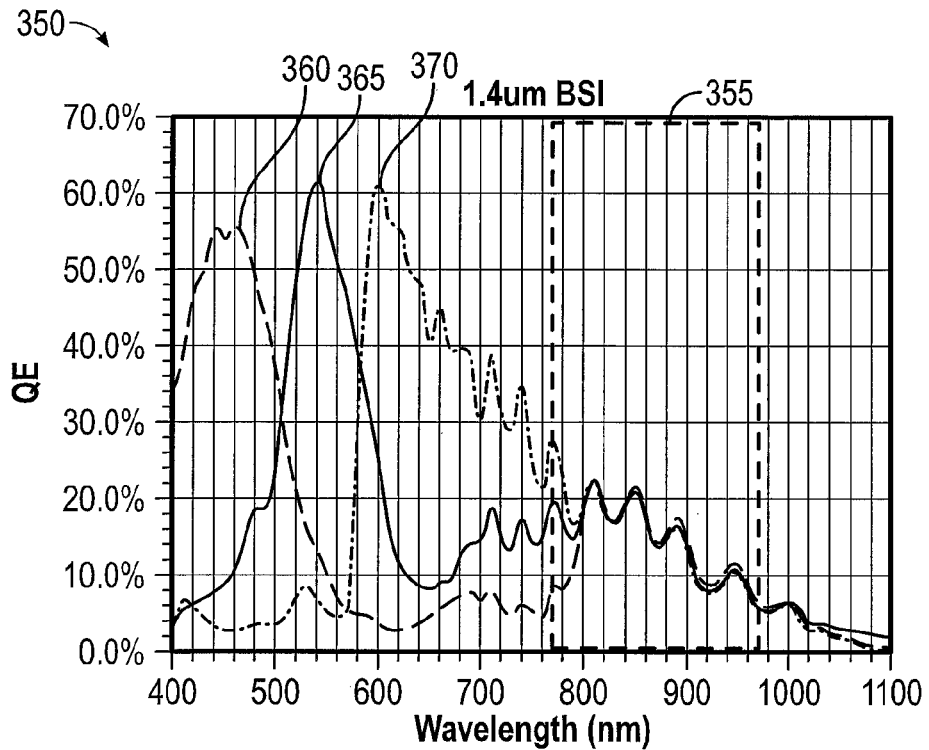

FIGS. 3A and 3B each include a graph indicating spectral responses of a front-side illumination (FSI) device (FIG. 3A) and a back-side illuminated (BSI) image sensor (FIG. 3B), highlighting the NIR wavelength region and the associated ability for the respective devices to realize signals having wavelengths within the NIR region. FIGS. 3A and 3B highlight the NIR wavelength region and the associated ability for the respective devices to realize signals having wavelengths within NIR regions 305 and 355, respectively. A spectral response can be characterized by a ratio of current generated by a photodiode in response to its exposure to light. The spectral response may also be expressed as a Quantum efficiency, as shown in the graphs illustrated in FIGS. 3A and 3B along the y-axis.

In particular, FIG. 3A is a graph 300 illustrating an example of Quantum efficiency of an FSI device, for each of red light 310, green light 315, and blue light 320, relative to the received wavelength. In various embodiments, a thickness of the FSI device may vary. Along the x-axis of the graph 300 is the wavelength of the received signal, from 400 nanometers (nm) to 1100 nm. Along the y-axis is the Quantum efficiency of the sensor of the FSI device at which the received light is realized. The term "realized" in relation to the received light may correspond to an ability of the sensor to convert the received light to a current corresponding to a wavelength of the received light. For example, if the sensor is unable to utilize the entire wavelength of the received light when converting the light to current, the sensor is unable to fully realize the received light. The graph 300 also shows a window from approximately 760 nm to approximately 960 nm, indicating the near-infrared ("NIR") light region 305.

As shown by the graph 300, the light is received with greater than 50% efficiency at under 600 nm, but as the wavelength of the received light increases (moving along the x-axis of the graph 300 to the right), the Quantum efficiency of the FSI devices decreases. As will be discussed further below, this may be due to the thickness of a photodetector region of the FSI device in relation to the wavelength of the NIR light.

FIG. 3B is a graph 350 illustrating an example of the Quantum efficiency of a back side illuminated ("BSI") device (or sensor) for each of red light 370, green light 365, and blue light 360, relative to the received wavelength. In various embodiments, a thickness of the BSI device may vary. Along the x-axis of the graph 350 is the wavelength of the received signal, from 400 nm to 1100 nm. Along the y-axis is the Quantum efficiency of the sensor of the BSI sensor at which the received light is converted to current. The graph 350 also shows a window from approximately 760 nm to approximately 960 nm, indicating the NIR light region 355.

As illustrated in the graph 350, the light is received with greater than 50% efficiency at under 600 nm, but as the wavelength of the received light increases (moving along the x-axis of the graph 350 to the right), the Quantum efficiency of the BSI sensor decreases. As will be discussed further below, this may be due to the thickness of a photodetector region of the BSI sensor in relation to the wavelength of the NIR light.

As can be seen by comparing FIGS. 3A and 3B, within the NIR region represented by NIR regions 305 and 355, the FSI device is generally more efficient for converting received light to current. Within the NIR region 305, the FSI device has a maximum efficiency of approximately 30%, while the BSI sensor maximum is approximately 20% in the NIR region 355. However, while the FSI device may provide higher NIR (and greater wavelength) Quantum efficiencies than the BSI image sensor, the FSI may not be compatible with 3D stacked sensor (and similar) technology and practices, and thus may not be a suitable replacement BSI image sensors in some applications (for example due to size constraints, etc.). The behavior of the FSI and BSI devices with regards to their lack of efficiency at converting received light to current is independent of pixel size.

Figure 4:
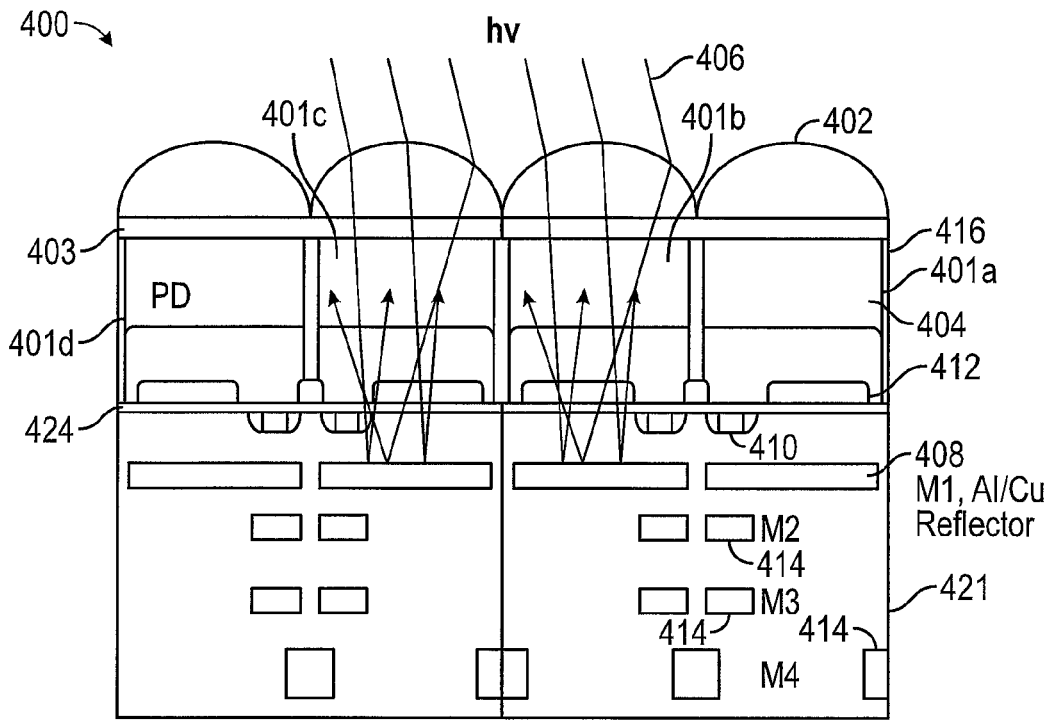
FIG. 4 shows an embodiment of a cross section of a 3D stacked BSI sensor (including four pixels) incorporating metal reflectors to cause light to reflect back through a photodetector region and improve spectral response of the BSI image sensor.

FIG. 4 shows an embodiment of a cross section of a 3D stacked BSI sensor (including four pixels) incorporating metal reflectors to cause light to reflect back through a photodetector region and improve spectral response of the BSI image sensor. The BSI sensor may form a compacted depth sensing camera module that functions effectively in mobile applications. The cross section of the BSI sensor 400 shows four sensor pixels 401a, 401b, 401c and 401d. For clarity, only the structure of pixel 401a is described, each of the sensor pixels 401a-d having a similar structure. Pixel 401a includes a microlens 402 and an n-type photodetector region (photodetector region) 404, a metal reflector 408, a transfer gate 410, a p-type photodetector region 412, three rows of metal interconnects/layers 414, a photodetector isolation region 416 configured to suppress pixel signal crosstalk, and a substrate portion 421 within which the transfer gate 410 and the metal interconnects/layers 414 and metal reflector 408 are disposed. The BSI sensor includes a high refractive index film between the photodetector region 404 and the substrate portion 421. The high refractive index film may be configured to prevent at least a portion of light from propagating from the photodetector region 404 to the substrate portion 421. The BSI sensor also may include an antireflection layer 403 that is configured to allow light to pass from the microlens 402 through the antireflection layer 403 and into the photodetector region 404, and prevents at least some light from propagating from the photodetector region 404 to the microlens 402. The photodetector isolation region 416 suppresses pixel signal crosstalk. In some embodiments, neighboring pixels of the BSI sensor 400 may share the substrate portion and one or more of a reset transistor, a selection transistor, and an amplifying transistor (not shown in this figure). In some embodiments, the metal interconnects/layers 414 and metal reflector 408 may comprise one or more portions of the reset, selection, and amplifying transistors. In FIG. 4, light 406 (for example NIR light) enters the photodetector region 404 from the top of the figure.

As illustrated in the example of the BSI sensor 400 for pixels 401b and 401c, the light 406 may pass through the microlens 402, which focus the light 406 and directs it to propagate through the photodetector region 404. The photodetector region 404 may convert at least a portion of the light 406 into current. For the example of the BSI sensor 400 shown, the photodetector region 404 of each pixel may be formed from silicon and may be less than 3 microns thick. Light 406, having a wavelength in the NIR or longer range, may have a penetration depth that exceeds the thickness of the photodetector region 404. For example, the penetration depth of the light 406 into silicon may be beyond 5 microns. Thus, when the photodetector region 404 are formed of silicon and have a thickness of less than 3 microns, the photodetector region 404 may not effectively convert the light 406. For example, the full energy from the light 406 may not be converted to current. Accordingly, the photodetector region 404 may be too thin to convert all of the light 406 to current, as a portion of the light 406 (when in the NIR or greater wavelength range) may pass through the photodetector region 404 without being converted to current. Thus, a portion of the energy in the light 406 that is not converted to current can be lost as it may continue to penetrate the substrate of the BSI sensor without being converted to electricity.

As illustrated in FIG. 4, the substrate 421 BSI sensor may include multiple metal interconnects or metal layers. For example, the metal reflector ("M1") 408 and metal interconnects/layers ("M2-M4") 414, which may include wiring or transistors internal to the BSI sensor 400. The metal reflector 408 and the metal interconnects/layers 414 may be located at various depths within the substrate of the BSI sensor 400. The metal interconnects or metal layers may serve as power supply, ground, clock, and video signal lines, etc.

As shown in FIG. 4, the metal reflector 408 may be the top most metal layer (closest to the photodetector region 404). In some embodiments, the metal reflector 408 is wider than the M2-M4 metal interconnects/layers 414. This is because the metal reflector M1 408 may be configured to reflect the light 406, which passes through the photodetector region 404 without being converted to current, back through the photodetector region 404. The metal reflector 408 may be located adjacent to the photodetector region 404 and may be closest to the photodetector region 404 compared to other metal interconnects/layers 414 illustrated in FIG. 4. In some embodiments the metal reflector 408 includes one or more metal layers. There also may be fewer components between the metal reflector 408 and the photodetector region 40, compared to the other metal interconnects/layers 414. In some embodiments, the metal reflector 408 is configured to be wider than the other metal interconnects/layers 414 to increase the amount of light reflected by the metal reflector 408. This may minimize the amount of the light 406 that is lost due to reflections off of, or absorption by, other components within the substrate 421 of the BSI sensor.

In some embodiments (as shown in FIG. 4), the metal reflector 408 may be the same width as, or substantially the same with as, the photodetector region 404 for each pixel of the BSI image sensor. For example, the metal reflector 408 may be 95% or greater of the width as the photodetector region 404 of a pixel. In some embodiments, the metal reflector 408 may be 90% or greater of the width as the photodetector region 404 of a pixel. In some embodiments, the metal reflector 408 may be 85% or greater of the width as the photodetector region 404 of a pixel. Additionally, the metal reflector 408 may be located as close to the photodetector region 404 as possible, further minimizing the light 406 that is lost within the substrate of the BSI sensor 400. In some embodiments, when the substrate of the BSI sensor 400 is formed from a material with a low refraction (for example, glass, having a refractive index of approximately 1.4), the distance between the photodetector region 404 and the metal reflector 408 may be increased with minimal penalty. However, in some embodiments, the metal reflector 408 may not be formed within the photodetector region 404 because the metal reflector 408 has a lower melting point than the silicon material of the photodetector region 404.

The metal reflector 408 may thus contaminate the photodetector region 404 if it is embedded within the photodetector region 404.

Reflecting the light 406 back through the photodetector region 404 may allow the photodetector region 404 to increase the amount of the light 406 converted to power regardless of the wavelength of the light 406 (for example, where the light 406 has a penetration depth of less than twice the thickness of the photodetector region 404 so that light that passes through the photodetector region for a second time is absorbed). Thus, where the light 406 may include NIR light having a penetration depth into silicon photodetectors of 5 microns, when the silicon photodetector has a thickness of 3 microns, the metal reflector 408 may reflect the NIR light back through the photodetector region 404. In this example, this reflection of the light 406 back through the photodetector region 404 may allow the photodetector region 404 to convert to current the remaining amount the light 406 that was not converted to current on the first pass through the photodetector region 404 when it travels a distance of 2 microns through the photodetector region 404. Thus, the metal reflector 408 effectively doubles the thickness of the photodetector region 404. The ability for the photodetector region 404 to convert the light 406 to current increases the quantum efficiency of the BSI sensor 400.

Figure 5A:
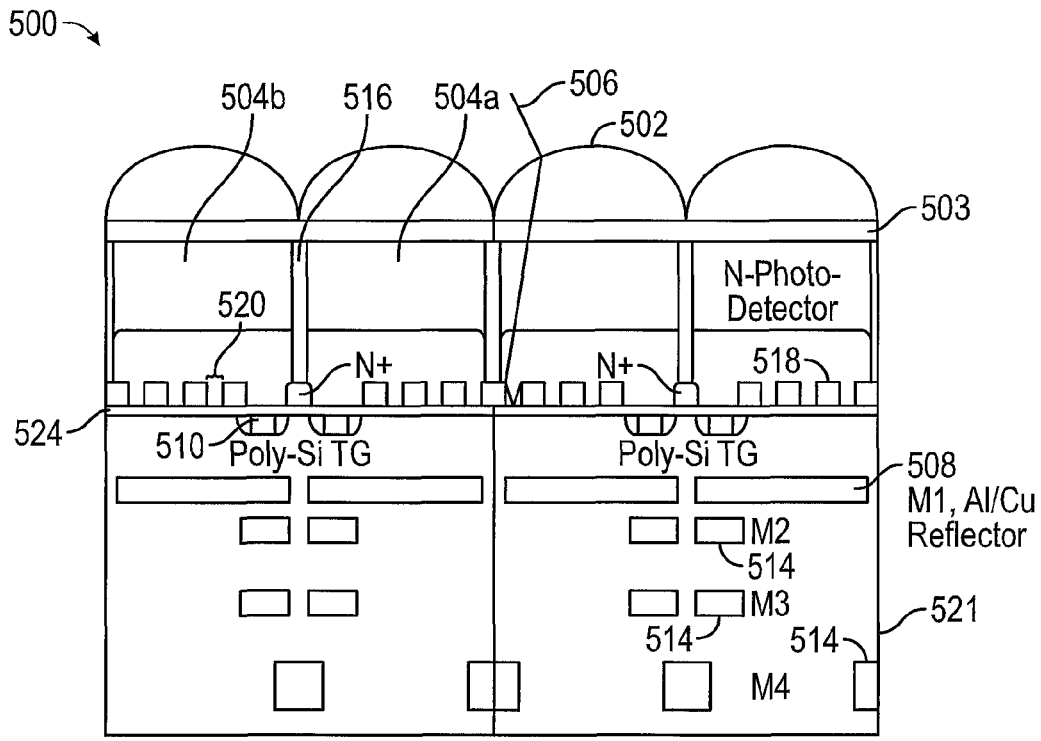
FIG. 5A is an illustration of an embodiment of the 3D stacked BSI sensor of FIG. 4 further incorporating a reflective grating to cause light to reflect back through the photodetector region and improve spectral response of the BSI image sensor.
Figure 5B:
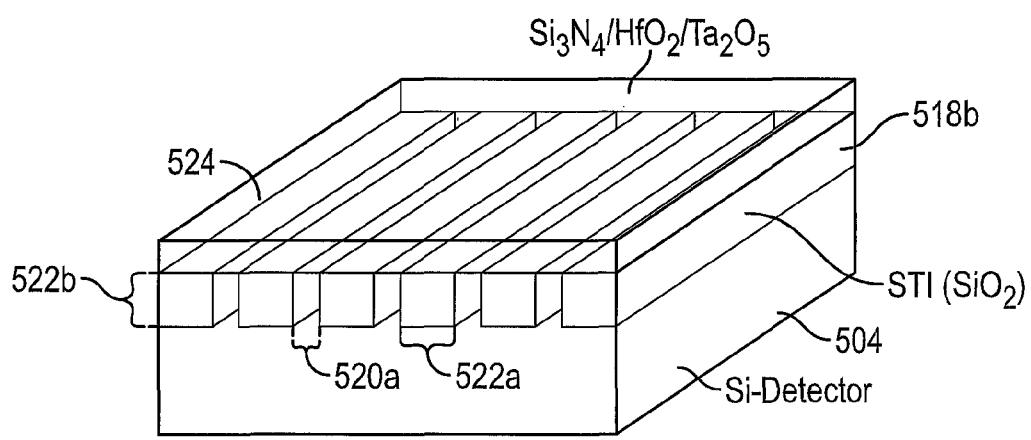
FIG. 5B is an illustration of an embodiment of the 3D stacked BSI sensor of FIG. 5A including a single period reflective grating.
Figure 5C:
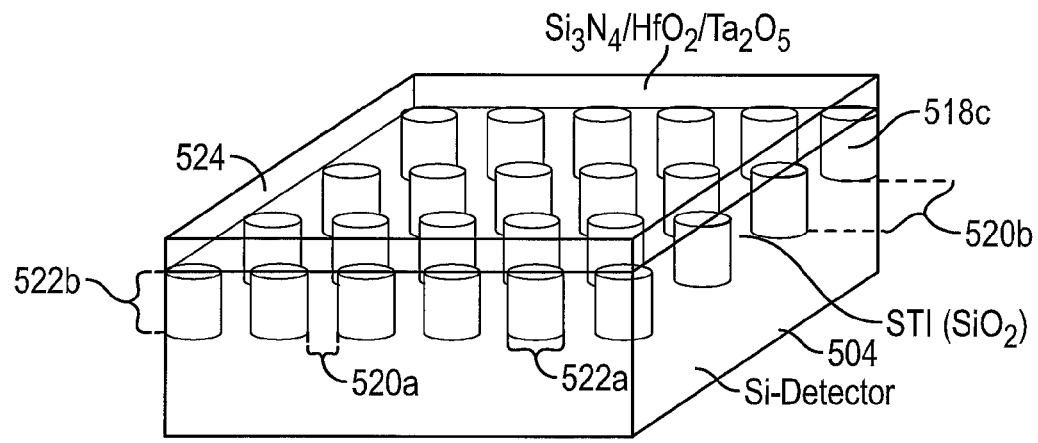
FIG. 5C is an illustration of an embodiment of the 3D stacked BSI sensor of FIG. 5A including a bi-periodic reflective grating having a different shape.
Figure 5D:
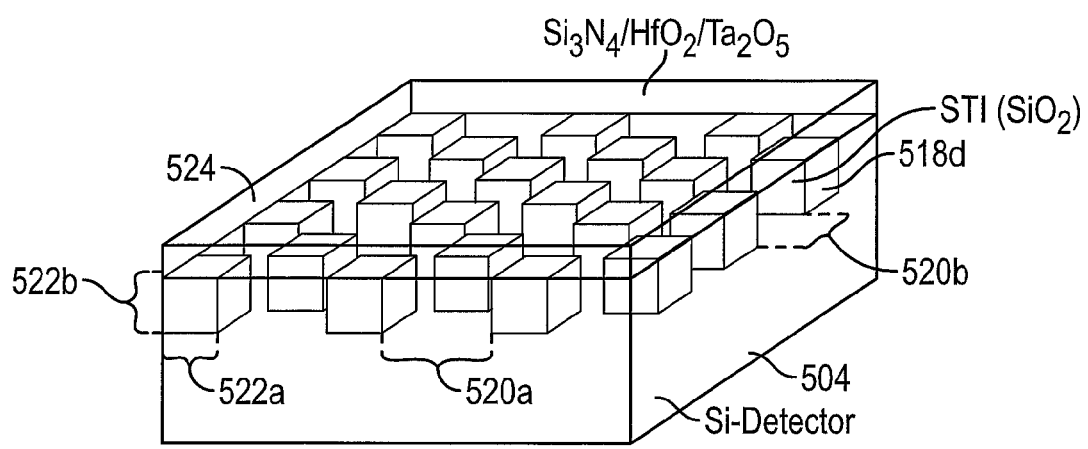
FIG. 5D is an illustration of another embodiment of the 3D stacked BSI sensor of FIG. 5A including a bi-periodic reflective grating having a different bi-periodic layout.

FIG. 5A is an illustration of an embodiment of the 3D stacked BSI sensor of FIG. 4 further incorporating a reflective grating to cause light to reflect back through the photodetector region and improve spectral response of the BSI image sensor. The BSI sensor 500 shown in FIG. 5A includes many of the same components as shown and discussed in relation to FIG. 4, and such components need not be discussed again here. In the example illustrated in FIG. 5A, the reflective structures are a reflective "grating" 518 positioned within the photodetector region 504 adjacent to and in the proximity of a substrate 521 of the BSI sensor 500. In some embodiments, the grating 518 may be a set of structures that are periodically arranged, some examples of which are illustrated in FIGS. 5B, 5C and 5D. In some embodiments, the structures are randomly arranged, and such structures can have different reflection characteristics compared with structures that are periodically arranged. In some embodiments, the gratings 518 are formed of a silicon dioxide material. The grating 518 may reflect the light 506 within the photodetector region 504 of the BSI sensor 500 without causing the reflected light to impact or interfere with neighboring pixels of the BSI sensor 500. For example, when the reflective structure (metal reflector 508) is placed within the substrate 521 after the light 506 passes through and out of the photodetector region 504, the light reflecting off of the metal reflector 508 may reflect into a neighboring photodetector region 504 due to lack of physical barriers or dividers between the substrate regions of neighboring shared pixels. Dividing or separating the photodetector regions 504 using photodetector isolation regions 516 lowers the chances that the light reflecting off of a reflective structure (for example, grating 518) located within a first photodetector region 504a will propagate to a second photodetector region 504b adjacent to the first photodetector region 504a.

In some embodiments, the photodetector isolation regions 516 may comprise the same material(s) as the reflective gratings 518, and the gratings 518 may be formed of or coated with the similar materials as metal reflectors 508 and 514. For example, the grating 518 may comprise (e.g., be formed of or coated by) one or more of silver, copper, gold, aluminum, platinum, rhodium, and chromium. Each of these materials may reflect over 60% of light within or above the NIR wavelength range. Additionally, the BSI sensor 500 manufacturing process may already use these materials, so there may be only a nominal cost to the process to add these materials in the form of the grating 518. Accordingly, the manufacturing process of a BSI sensor may incorporate the construction of the gratings 518 into each photodetector region 504. Alternatively, or additionally, the manufacturing process of a BSI sensor may be modified to incorporate the construction of the metal reflector 508 into each photodetector region 504 or into each substrate 521 below the photodetector region 504. In some embodiments, the construction of the BSI sensor may be modified to incorporate the construction of either or both the gratings 518 into each photodetector region 504 and the construction of the metal reflector 508 below the photodetector region 504 within the substrate 521. Such leveraging of the existing construction process and existing pixel physical design and manufacturing may allow the modification of the BSI sensor discussed with no additional layers (for example, no additional mask layer) or steps, as the construction of the metal reflector 408 or the gratings 518 may be integrated into existing construction process steps.

In some embodiments, the BSI sensor 500 includes an anti-reflection layer 503 shown between the microlenses 502 and the photodetector regions 504. The anti-reflection layer 503 may be formed such that light may propagate through the microlens 502 and through the anti-reflection layer 503 but light does not pass through (or only a minimum amount of light passes through) the anti-reflection layer 503 from the photodetector region 504 to the microlens 502. Such modifications provide for an increase in the resolution of the Quantum efficiency of the BSI sensor pixels and increases in depth map coding accuracy, distance range, and non-linearity of these pixels.

Similar to the metal reflector 508, the gratings 518 may cause the light 506 to reflect within the photodetector region 504. The grating 518 may better confine the incident light, especially light of a longer wavelength (for example, wavelengths greater than 700 nm), inside a grating cavity (a cavity formed between adjacent gratings) so as to enhance charge collection efficiency. Accordingly, adjacent gratings may cause the light 506 to reflect off of each other within the grating cavity, extending a path of the light 506 within the photodetector region 504.

Spacing of the gratings (for example, a distance between neighboring gratings) generally follows the Bragg Diffraction Law, $n\lambda = 2d \sin \theta$. For example, for an IR signal having an 800 nm wavelength, the distance d between consecutive gratings may be approximately 0.4 micron. In some embodiments, the gratings are spaced from between 0.2 and 0.4 microns apart. Additionally, or alternatively, a size of the gratings may be adjusted based at least in part on the wavelength of the signal or light being absorbed by the photodetector region. In some embodiments, the spacing, size, and/or shape of the gratings are not consistent throughout the photodetector region. In some embodiments, as shown in FIG. 5A, the gratings 518 may be used in combination with the reflective metal reflectors 508. Embodiments illustrated in FIGS. 5B-5D show examples that include a high refractive index film 524 deposited on top of the gratings 518. The high refractive index film 524 may serve to improve the trapping of light within the grating cavities formed for neighboring gratings 518. In some embodiments, the high refractive index film 524 may comprise a material having a higher refractive index than glass (for example, greater than 1.4). For example, the high refractive index film 524 may comprise one of $Si_3N_4$, $HfO_2$, or $Ta_2O_5$, among others.

FIG. 5B is an illustration of an embodiment of the 3D stacked BSI sensor of FIG. 5A including a single period reflective grating. The single periodic grating 518b may include one or more structures having a height and width, and that extend along a length of the photodetector region 504. "Single period" in this example indicates that the gratings 518 are periodic along a single axis of the photodetector region 504 along the width of the photodetector region 504 (Si-Detector) in FIG. 5B. With the single periodic grating 518b, gaps or spaces 520a between neighboring gratings may exist in only one axis of the plane of the single periodic grating 518b, for example, extending into the page relative to the orientation of FIGS. 5A and 5B. Distance 522a corresponds to the width of the single periodic grating 518b along the periodic axis across the width of the photodetector region 504. A distance 522b corresponds to the height of the single periodic grating 518b along the height of the photodetector region 504.

FIG. 5C is an illustration of an embodiment of the 3D stacked BSI sensor of FIG. 5A including a bi-periodic reflective grating having a different shape. The bi-periodic grating 518c illustrated in FIG. 5C may include a plurality of structures having a height, width, and length that are arranged in an array within a photodetector region 504. "Bi-periodic" is in reference to gratings being periodic along two axis of the photodetector region 504 (for example, along the width and the depth of the photodetector region 504 (Si-Detector) in FIG. 5C). With the bi-periodic grating 518c, gaps 520a and 520b may exist in both axes of the plane of the grating 518, as shown in FIG. 5C. For example, the gaps 520a may include the gaps or spaces along the width of the photodetector region 504 as shown in FIG. 5C, while the gaps 520b may include the gaps or spaces that divide individual gratings 518 as they extend into the page. The gaps 520a and 520b may have the same distance or may be different distances. FIG. 5C depicts the bi-periodic grating 518c as having a cylindrical shape instead of a rectangular or cubic shape as in FIGS. 5A, 5B, and 5D; however, in some examples the bi-periodic grating 518c may include rectangular structures, square structures, or structures of a different shape. Distance 522a corresponds to the width of the bi-periodic grating 518c along the periodic axis across the width of the photodetector region 504. A distance 522b corresponds to the height of the bi-periodic grating 518c along the height of the photodetector region 504. In some embodiments, each of the grating structures in the bi-periodic grating 518c may be located in the same plane within the photodetector region 504, while in other embodiments, the grating 518 may be located in various planes within the photodetector region 504 (not shown). In various embodiments, the bi-periodic grating 518c may have different dimensions or be made from different reflective materials.

FIG. 5D is an illustration of another embodiment of the 3D stacked BSI sensor of FIG. 5A including a bi-periodic reflective grating having a different bi-periodic layout. The bi-periodic grating 518d may include a plurality of structures having a height, width, and length that are arranged in an array within the photodetector region 504, where alternating rows of gratings are offset to form a "checkerboard" type structure. The bi-period may suggest that the gratings are periodic along two axes of the photodetector region 504 (along the width and the depth of the photodetector region 504 (Si-Detector) in FIG. 5D). With the bi-periodic grating 518d, gaps 520a and 520b may exist in both axes of the plane of the reflective grating structure 518, as shown in FIG. 5D. For example, the gaps 520a may include the gaps or spaces along the width of the photodetector region 504 as shown in FIG. 5D, while the gaps 520b may include the gaps or spaces that separate individual gratings as they extend into the page. The gaps 520a and 520b may have the same distance or may be different distances. Distance 522a corresponds to the width of each bi-periodic grating 518d along the periodic axis across the width of the photodetector region 504. A distance 522b corresponds to the height of the bi-periodic grating 518d along the height of the photodetector region 504. FIG. 5D also depicts the grating 518 as having a cubic or rectangular shape as in FIGS. 5A and 5B. In some embodiments, each of the gratings of the bi-periodic grating 518d may be placed in the same plane within the photodetector region 504, while in other embodiments, the gratings of the bi-periodic grating 518d may be placed in various planes within the photodetector region 504 (not shown). In various embodiments, the bi-periodic grating 518d may have different dimensions or be formed of different reflective materials.

In the manufacturing process describe above, the BSI devices having the structures shown in FIGS. 4-5D may be formed via front end of line (FEOL) processes. For example, the FEOL process may include all manufacturing processes of the BSI device up to (but not including) the back end of line (BEOL) processes. The FEOL processes may include forming individual devices that are formed on or from a semiconductor material. For example, the photodetector region 404 and 504, the photodetector isolation regions 416 and 516, and the grating 518 may be formed during the FEOL processes. Integrating the forming of the grating 518 with the FEOL process may simplify the formation of the grating 518 and reduce the overall cost of incorporating such structures in the photodetectors. In some embodiments, shallow trench isolation (STI) or similar processes may be used to isolate the devices formed on or from the semiconductor material, such as the photodetector regions 504. In some embodiments, the photodetectors may be isolated using implant isolation, for example using p+ isolation.

The BEOL processes may involve connecting the structures and devices formed during the FEOL processes with wiring and/or metal layers. For example, as shown in FIGS. 4 and 5, the BEOL processes may involve forming the metal layers M1, M2, M3, and M4 and the surround substrate in which they are located. In some embodiments, the antireflection and microlens layers are applied after the FEOL and BEOL processes are complete. The high refractive index film 524 may be formed during either the FEOL or BEOL processes, as the high refractive index film 524 may be positioned between the photodetector 404/504 material and the substrate of the metal layers region. As mentioned above, the grating 518 use the same formation procedure to form is either a single period or bi-periodic.

FIGS. 6A-6D include four top down views of the shared pixels BSI sensor of FIGS. 4 and 5. The FIGS. 6A-6D as shown do not include the microlens 402 (FIG. 4). Each of the FIGS. 6A-6D show a 2×2 pixel array and associated shared transistor regions. The NIR light that penetrates the silicon photodetector regions (photodetector regions) 604 may be eventually lost or may dissipate as it continues to penetrate the photodetector regions 604.

Figure 6A:
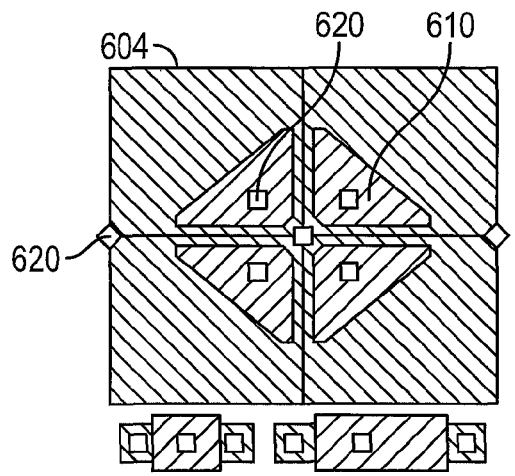
FIGS. 6A-6D include four top down views of the shared pixels BSI sensor of FIGS. 4 and 5.
Figure 6B:
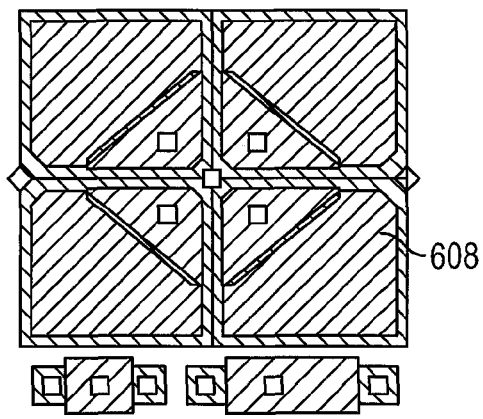
Figure 6C:
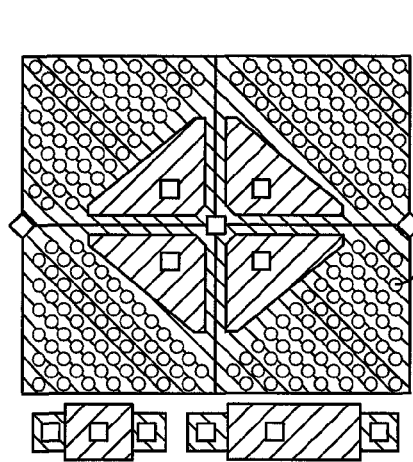

FIG. 6A shows the 2×2 pixel array without either the metal reflector 408 (FIG. 4) or the grating 518 (FIG. 5). FIG. 6B shows the 2×2 pixel array with only the metal reflector 408. FIG. 6C shows the 2×2 pixel array with only the grating

Figure 6D:
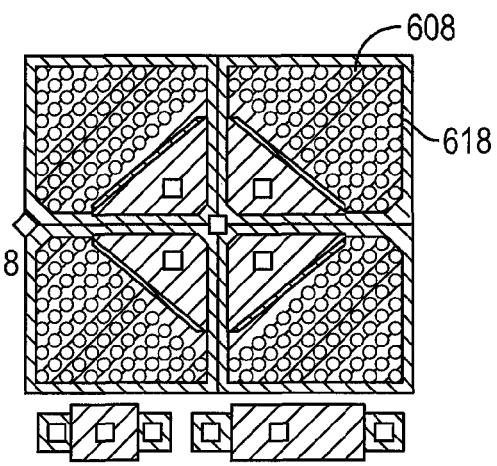

518. FIG. 6D shows the 2×2 pixel array with both the metal reflector 408 and the grating 518. Each of the FIGS. 6A-6D also show shared reset and source/follower amplifiers. In these figures, the light entering the BSI sensor may come from inside the page.

FIG. 6A shows only the 2×2 pixel architecture including the transfer gates 610 (corresponding to transfer gate 410 of FIG. 4), photodetector (or active or pixel transistor) regions 604 (corresponding to photodetector region 404 of FIG. 4), and contacts 620 (p+ substrate tie (diamond) to combat ground bouncing (for example, providing a solid ground), while the square is the n+ contact). The contacts 620 may comprise points of contact between different layers of the BSI image sensor. The horizontal regions below each 2×2 pixel architecture comprises the transistors and associated components that are shared by the 2×2 structure above. FIG. 6B shows the 2×2 pixel architecture of FIG. 6A with the added metal reflectors 608 (corresponding to metal reflectors 508) for each of the photodetector regions 604. As discussed above, the metal reflectors 608 may be formed to be substantially the same size as the photodetector region 604. In other words, the metal reflectors 608 may have the same, or substantially the same, cross-sectional area as a sensor pixel. Accordingly, the area of the metal reflector 608 may be smaller than the area of the photodetector region 604 as seen in FIG. 6B. As shown in FIG. 6B, the metal reflectors 608 also overlap with the transfer gates (or polygate region) 610 of each of the pixels. However, in some embodiments, the metal reflectors 608 may not overlap with the transfer gates 610 of each of the pixels.

FIG. 6C includes the 2×2 pixel architecture of FIG. 6A with the added array of gratings 618 (corresponding to grating 518) for each of the photodetector regions 604. As shown, the array of gratings 618 may be configured to cover substantially all portions of the photodetector region 604. Though not shown here, the array of gratings 618 may be configured to have more or less area of the photodetector region 604 covered. In some embodiments, the array of gratings 618 may comprise any other shape or may comprise a plurality of shapes. Additionally, though not shown in this figure, the array of reflective grating structures may be configured to overlap with the transfer gates 610 of the pixels. FIG. 6D includes the 2×2 pixel architecture of FIG. 6A with the added metal reflectors 608 of the FIG. 6B and the array of gratings 618 of FIG. 6C. As shown, the metal reflectors 608 and the array of gratings 618 may be configured to cover substantially the entire photodetector region 604 as shown. Though not shown in FIGS. 6C and 6D, the high refractive index film may overlap the gratings 618 and the STI region shown by the photodetector regions 604.

Figure 7:
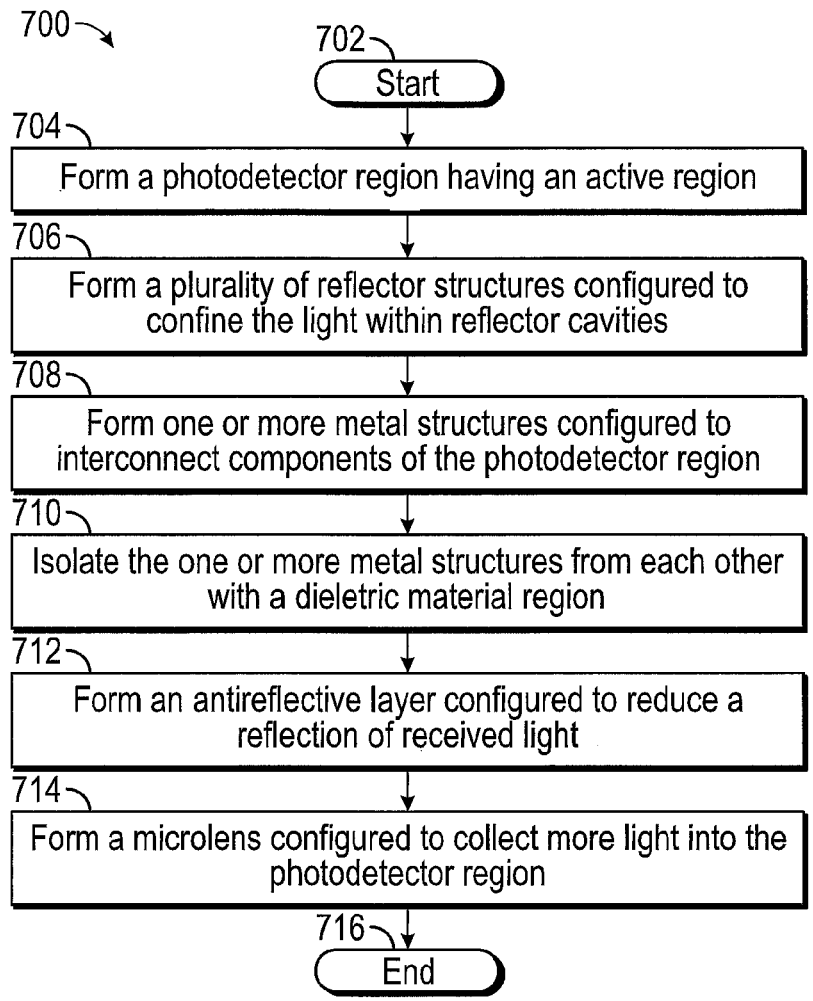
FIG. 7 is a flowchart illustrating an example of a method of manufacturing a BSI image sensor, according to some embodiments.

FIG. 7 is a flowchart illustrating an example of a method of manufacturing a BSI image sensor, according to some embodiments. The method 700 begins at block 702 and proceeds to block 704. At block 704, the method 700 of manufacturing the BSI image sensor forms one or more photodetector regions having an active region. For example, the one or more photodetector regions may correspond to the photodetector region 404 of FIG. 4. The method 700 then proceeds to block 706, where it forms one or more reflector structures configured to confine the light within the reflector cavities. The reflector structures may comprise the one or more grating structures 518 (FIG. 5), and the reflector cavities may be the spaces between the grating structures 518, e.g., gaps 520. The method 700 then proceeds to block 708, where it forms one or more metal structures configured to interconnect components of the photodetector region. These one or more metal structures may comprise any of the metal components that are formed within the substrate portion 421 (FIG. 4), such as the transfer gates, the metal layers 414, metal reflector 408, etc. Once these one or more structures are formed, the method 700 proceeds to block 710, where the one or more metal structures are isolated from each other with a dielectric material region, which may correspond to the substrate portion 421. The method 700 that progresses to block 712, where an antireflective layer is formed on the edge of the photodetector region opposite the metal structures. The antireflective layer may correspond to the antireflection layer 403 of FIG. 4. Then the method 700 proceeds to block 714, where one or more microlenses are formed and configured to collect more light into the one or more photodetector regions. The microlenses may correspond to the microlenses 402 of FIG. 4. After forming the one or more microlenses, the method 700 ends at block 716. The blocks of method 700 indicated above may be performed in any order. Alternatively, the method 700 may include additional blocks not shown here or may exclude blocks shown here.

Figure 8:
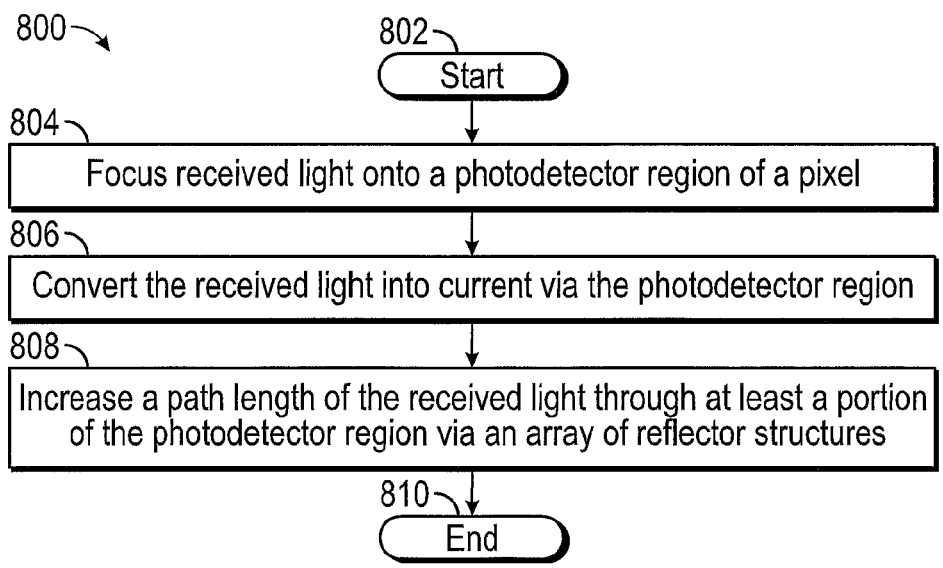
FIG. 8 is a flowchart illustrating an example of a method of capturing an image via an IR sensor, according to some embodiments.

FIG. 8 is a flowchart illustrating an example of a method of capturing an image via an IR sensor, according to some embodiments. The method 800 begins at block 802 and proceeds to block 804. At block 804, the method 800 focuses received light onto a photodetector region of a pixel. The photodetector region may correspond to the photodetector region 404 of FIG. 4 above, and the pixel may correspond to a structure comprising the photodetector region 404 and any associated substrate and metal interconnections, isolated from neighboring photodetector regions 404 and metal interconnections. In some embodiments, the light is focused via the microlenses 402 of FIG. 4. The method 800 then proceeds to block 806, where the method 800 converts the received light into current via the photodetector region. The method 800 then proceeds to block 808, where a path length of the received light is increased through at least a portion of the photodetector region via an array of one or more reflector structures. In some embodiments, the reflector structures may correspond to the gratings 518 (FIG. 5). Increasing the path length may allow the photodetector region to convert a larger amount of the received light into current. In some embodiments, the reflector structures may be combined with the metal reflector 508. The method 800 then ends at block 810.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

As used herein, the term interface may refer to hardware or software configured to connect two or more devices together. For example, an interface may be a part of a processor or a bus and may be configured to allow communication of information or data between the devices. The interface may be integrated into a chip or other device. For example, in some embodiments, an interface may comprise a receiver configured to receive information or communications from a device at another device. The interface (e.g., of a processor or a bus) may receive information or data processed by a front end or another device or may process information received. In some embodiments, an interface may comprise a transmitter configured to transmit or communicate information or data to another device. Thus, the interface may transmit information or data or may prepare information or data for outputting for transmission (e.g., via a bus).

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Thus, in some aspects computer readable medium may comprise non-transitory computer readable medium (e.g., tangible media).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

What is claimed is:

1. An IR sensor apparatus for capturing an image, comprising:
    an array of sensor pixels configured to convert light into current, each sensor pixel of the array of sensor pixels comprising:
        a photodetector region configured to convert the light into current;
        a lens configured to focus light, that is incident on the lens, into the photodetector region, the lens positioned adjacent to the photodetector region such that incident light propagates through the lens and into the photodetector region;
        a substrate disposed such that the photodetector region is between the substrate and the lens, the substrate having one or more transistors formed therein; and
        one or more reflective structures positioned within the photodetector region such that at least a portion of the photodetector region is between the one or more reflective structures and the lens, the one or more reflective structures configured to reflect the light that has passed through at least the portion of the photodetector region within the photodetector region.

2. The apparatus of claim 1, wherein the one or more reflective structures comprises an array of reflective structures disposed within the photodetector region of the sensor pixel.

3. The apparatus of claim 2, wherein the array of reflective structures comprises a grating having a plurality of surfaces that reflect the light.

4. The apparatus of claim 3, wherein the array of reflective structures comprises a plurality of structures each having a length that extends across the photodetector region of the sensor pixel, the array of reflective structures further comprising gaps disposed between adjacent structures.

5. The apparatus of claim 3, wherein the array of reflective structures comprises structures arranged in a bi-periodic two-dimensional array.

6. The apparatus of claim 3, wherein the array of reflective structures comprises structures arranged in a periodic two-dimensional array.

7. The apparatus of claim 3, wherein the array of reflective structures is positioned along an edge of the photodetector region adjacent to the substrate.

8. The apparatus of claim 3, wherein each sensor pixel of the array of sensor pixels further comprises an anti-reflective layer disposed between the lens and the photodetector region.

9. The apparatus of claim 1, wherein the one or more reflective structures comprise a reflector disposed within the photodetector region of each sensor pixel and having a surface aligned to reflect the light propagating through the photodetector region back into the photodetector region.

10. The apparatus of claim 1, further comprising a refractive layer configured to refract the light propagating through at least the portion of the photodetector region back through the photodetector region via a refractive film, the refractive film having a higher refractive index than the substrate.

11. A method for capturing an image with an IR sensor having an array of sensor pixels, comprising:
focusing light, via a lens, onto a photodetector region of a pixel of the array of sensor pixels;
converting the light into current via the photodetector region; and
reflecting the light propagating through at least a portion of the photodetector region into the photodetector region via one or more reflective structures positioned within the photodetector region of the pixel, wherein reflecting the light into the photodetector region increases a distance which the light travels within the photodetector region.

12. The method of claim 11, wherein the one or more reflective structures comprises an array of reflective structures disposed within the photodetector region of the pixel.

13. The method of claim 12, wherein the array of reflective structures comprises a grating having a plurality of surfaces that reflect light.

14. The method of claim 13, wherein the array of reflective structures comprises a plurality of structures each having a length that extends across the photodetector region of the sensor pixel, the array of reflective structures further comprising gaps disposed between adjacent structures.

15. The method of claim 13, wherein the array of reflective structures comprises structures arranged in a bi-periodic two-dimensional array.

16. The method of claim 13, wherein the array of reflective structures comprises structures arranged in a periodic two-dimensional array.

17. The method of claim 13, wherein the array of reflective structures is positioned along an edge of the photodetector region adjacent to a substrate of the pixel, the substrate disposed such that the photodetector region is between the substrate and the lens.

18. The method of claim 13, further comprising preventing light from the photodetector region to the lens via an anti-reflective layer disposed between the lens and the photodetector region.

19. The method of claim 11, wherein the one or more reflective structures comprise a reflector disposed within a photodetector of the pixel, the reflector disposed such that the photodetector region is between the substrate and the lens, and having a surface aligned to reflect light propagating through the photodetector region back into the photodetector region.

20. The method of claim 11, further comprising refracting the light propagating through at least the portion of the photodetector region back through the photodetector region via a refractive layer having a higher refractive index than a refractive index substrate of the pixel, the substrate disposed such that the photodetector region is between the substrate and the lens.

21. A method for manufacturing sensor pixel of an IR sensor for capturing an image, the IR sensor including an array of the sensor pixels, the method comprising:
forming a photodetector region configured to convert light into current;
forming a lens configured to focus the light that is incident on the lens onto the photodetector region, the lens positioned adjacent to the photodetector region such that the incident light propagates through the lens and into the photodetector region;
forming a substrate disposed such that the photodetector region is between the substrate and the lens, the substrate having one or more transistors formed therein; and
forming one or more reflective structures positioned within the photodetector region such that at least a portion of the photodetector region is between the one or more reflective structures and the lens, the one or more reflective structures configured to reflect the light that has passed through at least the portion of the photodetector region within the photodetector region.

22. The method of claim 21, wherein the one or more reflective structures comprises an array of reflective structures formed within the photodetector region of the sensor pixel.

23. The method of claim 22, wherein the array of reflective structures comprises a grating having a plurality of surfaces that reflect light.

24. The method of claim 23, wherein the array of reflective structures are formed to comprise a plurality of structures each having a length that extends across the photodetector region and having gaps disposed between adjacent structures.

25. The method of claim 23, wherein the array of reflective structures is formed to comprise structures arranged in a bi-periodic two-dimensional array.

26. The method of claim 23, wherein the array of reflective structures is formed to comprise structures arranged in a periodic two-dimensional array.

27. The method of claim 23, wherein the array of reflective structures is positioned along an edge of the photodetector region adjacent to the substrate.

28. The method of claim 23, further comprising forming an anti-reflective layer between the lens and the photodetector layer.

29. The method of claim 21, forming the one or more reflective structures comprises forming a reflector disposed within the photodetector region and having a surface aligned to reflect the light propagating through the photodetector region back into the photodetector region.

30. The method of claim 21, further comprising forming a refractive layer between the photodetector region and the substrate, the refractive layer configured to refract the light propagating through at least the portion of the photodetector region back through the photodetector region and having a higher refractive index than the substrate.

* * * * *